United States Patent
Lee et al.

(10) Patent No.: US 8,077,268 B2
(45) Date of Patent: Dec. 13, 2011

(54) THIN FILM TRANSISTOR SUBSTRATE AND METHOD OF MANUFACTURING THE SAME

(75) Inventors: Eun-Guk Lee, Yongin-si (KR); Chang-Oh Jeong, Suwon-si (KR); Je-Hun Lee, Seoul (KR); Do-Hyun Kim, Seoul (KR); Soon-Kwon Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 261 days.

(21) Appl. No.: 12/140,655

(22) Filed: Jun. 17, 2008

(65) Prior Publication Data
US 2009/0026450 A1    Jan. 29, 2009

(30) Foreign Application Priority Data
Jul. 27, 2007    (KR) .................. 10-2007-0075562

(51) Int. Cl.
*G02F 1/13* (2006.01)
(52) U.S. Cl. ........................................... 349/43
(58) Field of Classification Search .............. 349/43
See application file for complete search history.

(56) References Cited

U.S. PATENT DOCUMENTS

| 7,382,421 | B2 * | 6/2008 | Hoffman et al. | 349/43 |
| 7,502,093 | B2 * | 3/2009 | Baek | 349/187 |
| 2006/0043447 | A1 * | 3/2006 | Ishii et al. | 257/295 |
| 2007/0019122 | A1 * | 1/2007 | Lee et al. | 349/43 |
| 2007/0146567 | A1 * | 6/2007 | Yang et al. | 349/43 |

FOREIGN PATENT DOCUMENTS

| JP | 2005-077822 | 3/2005 |
| JP | 2006-186119 | 7/2006 |
| KR | 1020060124135 | 12/2006 |

* cited by examiner

*Primary Examiner* — Phu Vu
(74) *Attorney, Agent, or Firm* — Innovation Counsel LLP

(57) ABSTRACT

A thin film transistor array substrate comprising a base substrate, a first wire on the base substrate, a first insulating layer on the base substrate to cover the first wire, a semiconductor layer on the first insulating layer, a second insulating layer on the first insulating layer on which the semiconductor layer is formed, and a second wire on the second insulating layer on the second insulating layer is provided, and a portion of the second wire makes contact with the semiconductor layer through the contact hole.

20 Claims, 14 Drawing Sheets

THIN FILM TRANSISTOR SUBSTRATE AND METHOD OF MANUFACTURING THE SAME

The present invention claims Paris Convention priority of South Korean patent application No. 10-2007-0075562 filed on Jul. 27, 2007, incorporated herein by reference.

BACKGROUND OF THE INVENTION (a) Field of the Invention

The present invention relates to a thin film transistor substrate and its manufacturing method, and in particular, to a thin film transistor substrate having a stable thin film transistor characteristic and its manufacturing methods.

(b) Description of Related Art

A liquid crystal display (LCD) is one of the most widely used flat panel display types. An LCD includes two panels provided with field-generating electrodes such as pixel electrodes and a common electrode, and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

A thin film transistor substrate includes a gate line and a data line crossing each other on a base substrate, and a switching element connected to a pixel electrode.

Switching elements, such as thin film transistors, are used to apply voltages to the pixel electrodes switching elements. When a gate on voltage is applied to gate electrodes of the transistors, the transistors are turned on and supply voltages for images to the pixel electrodes through source electrodes of the transistors. When a gate off voltage is applied to the gate electrodes, the transistors are turned off and the pixel electrodes maintain the applied voltages.

General processes for thin film transistor array substrate will be explained below.

A gate wire is formed on a base substrate made of material such as glass.

A first insulating layer formed on the gate pattern and the base substrate by depositing a first insulating material.

The semiconductor layer is formed on the first insulating layer by depositing a semiconductor material.

A second wire is formed on the semiconductor layer and the first insulating layer.

A second insulating layer is formed on the second wire, a semiconductor layer and the first insulating layer.

A pixel electrode is formed on the second insulating layer.

However, the semiconductor layer will be made of amorphous silicon, poly-silicon, or semiconductor.

A thin film transistor made of amorphous silicon can be fabricated cost-effectively with good uniformity, but has poor characteristic of mobility and stability.

In contrast, a thin film transistor made of poly-silicon has good characteristic of mobility and stability, but has poor characteristic of uniformity and needs relatively high production cost.

A thin film transistor made of semiconductor oxide has good characteristics of mobility and stability, and can be fabricated cost-effectively with good uniformity.

However, in the event of forming semiconductor layer made of semiconductor oxide, it is very difficult to use dry-etching for patterning, therefore wet-etching will be used for this patterning. This means that the semiconductor oxide layer can be easily etched or damaged by an etchant that will be used in subsequent etching process and has a similar etching property to the etchant used in etch process for its own pattern.

During the aforementioned general processes for thin film transistor array substrate, the second wire is formed on the semiconductor layer. The patterning of the second wire is usually executed by wet-etching. Therefore, during the patterning of the second wire, the below semiconductor layer may be damaged by the wet-etching, which will give a bad effect on the characteristic of thin film transistor and display quality.

SUMMARY OF THE INVENTION

In order to provide a solution to the aforementioned problems, the present invention provides a thin film transistor array substrate capable of preventing damage of a semiconductor layer during etching processes.

The present invention also provides a method of manufacturing the thin film transistor array substrate.

In accordance with an embodiment of the present invention, a thin film transistor array substrate comprising a base substrate, a first wire on the base substrate, a first insulating layer on the base substrate to cover the first wire, a semiconductor layer on the first insulating layer, a second insulating layer on the first insulating layer on which the semiconductor layer is formed, and a second wire on the second insulating layer is provided, and a portion of the second wire makes contact with the semiconductor layer through a contact hole in the second insulating layer.

Also, the semiconductor layer includes semiconductor oxide. The semiconductor oxide may include zinc oxide. The semiconductor oxide may include indium or gallium.

The second wire may include a first conductive layer and a second conductive layer formed on the first conductive layer, and the first and second conductive layers may include different materials from each other.

The first conductive layer may include conductive oxide. The conductive oxide may include indium tin oxide (ITO) or indium zinc oxide (IZO).

The first conductive layer may include a gate line and a gate electrode electrically connected to the gate line. The second conductive layer may include a data line, a source electrode electrically connected to the data line and a drain electrode spaced apart from the source electrode. The source electrode and the drain electrode may be electrically connected to the semiconductor layer through contact holes formed through the second insulating layer, respectively.

The first conductive layer may include a first gate pad electrode electrically connected to the gate line. The first conductive layer may include a second gape pad electrode electrically connected to the first gate pad electrode through a contact hole formed through the first insulating layer. The second conductive layer may include a third gate pad electrode on the second gate pad electrode.

The first conductive layer may include a first data pad electrode electrically connected to the data line. The second conductive layer may include a second data pad electrode on the first data pad electrode.

The first conductive layer may include a pixel electrode electrically connected to the drain electrode.

In accordance with another embodiment of the present invention, a manufacturing method of a thin film transistor array substrate comprising forming a first wire on a base substrate, forming a first insulating layer on the base substrate to cover the first wire, forming a semiconductor layer on the first insulating layer, forming a second insulating layer on the first insulating layer on which the semiconductor layer is formed, forming a contact hole in the second insulating layer, forming a second wire on the second insulating layer is provided. A portion of the second wire makes contact with the semiconductor layer through the contact hole.

In order to form the second wire, a first conductive layer may be deposited on the second insulating layer. A second conductive layer may be deposited on the first conductive layer, and the second conductive layer may include different material from the first conductive layer. The first and second conductive layers may be etched to form a first conductive pattern and a second conductive pattern, respectively.

Also, the step of forming a second wire may include depositing a first conductive layer, depositing a second conductive layer and removing a portion of the second conductive layer to expose a portion of the first conductive layer.

BRIEF DESCRIPTION OF THE DRAWINGS

Use of the same reference symbols in different figures indicates similar or identical items.

DETAILED DESCRIPTION OF EMBODIMENTS

A thin film transistor array substrate according to an embodiment of the present invention will be explained with reference to FIGS. 1-7C.

Figure 1:
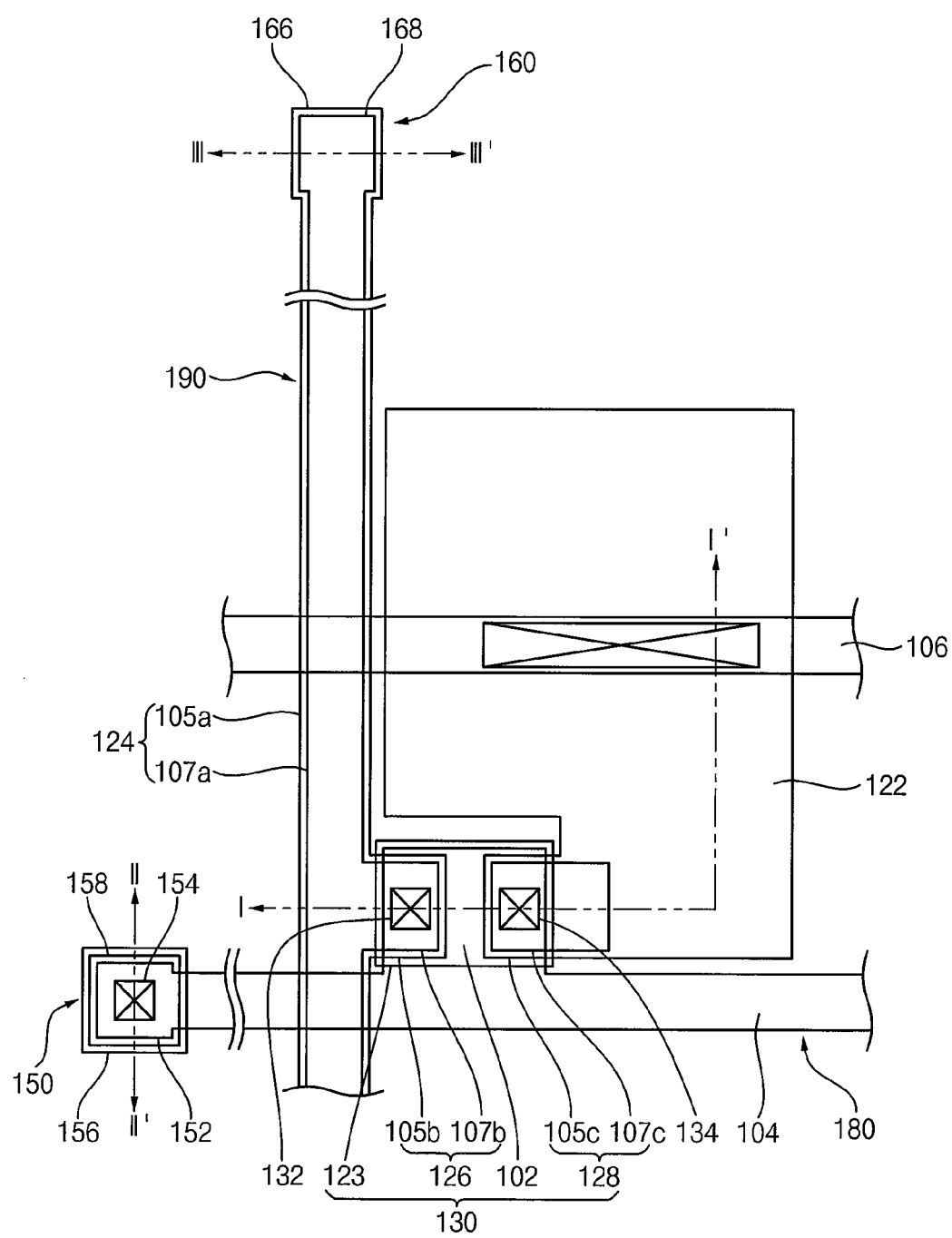
FIG. 1 is a layout to illustrate a part of a thin film array substrate according to an embodiment of the present invention.
Figure 2A:
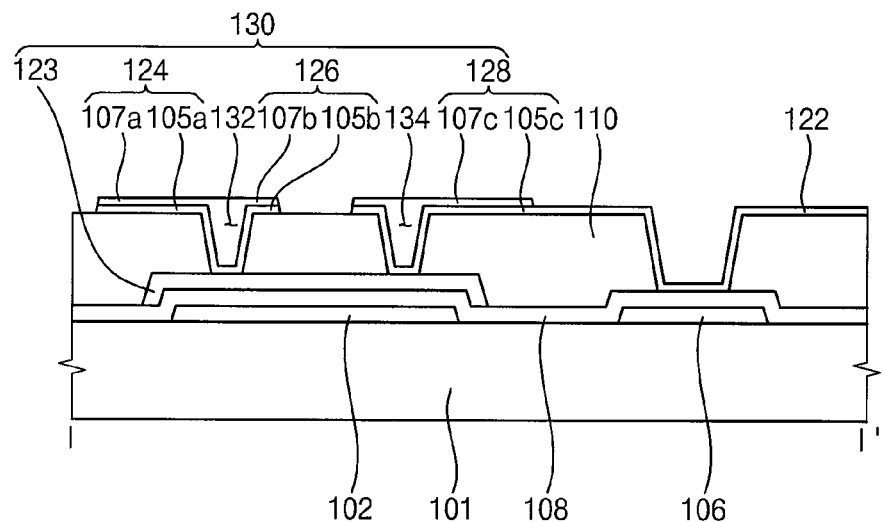
FIG. 2A is a sectional view taken along a line I-I' of FIG. 1.
Figure 2B:
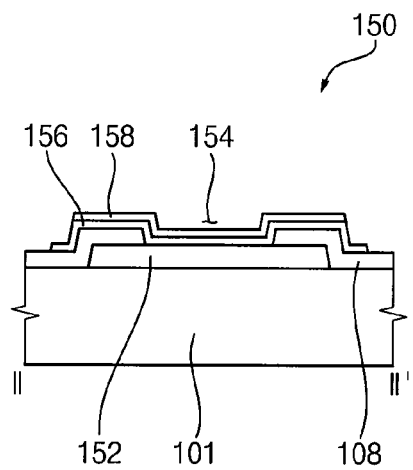
FIG. 2B is a sectional view taken along a line II-II' of FIG. 1.
Figure 2C:
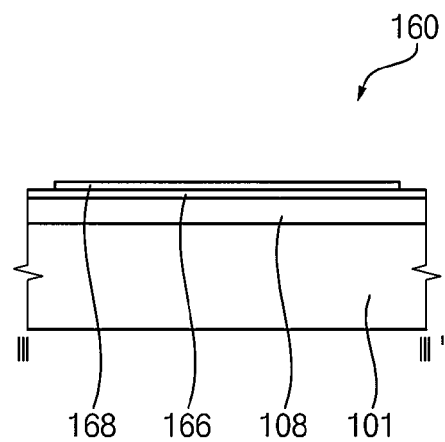
FIG. 2C is a sectional view taken along a line III-III' of FIG. 1.

FIG. 1 is a layout to illustrate a part of a thin film array substrate according to an embodiment of the present invention, and FIG. 2A is a sectional view taken along a line I-I' of FIG. 1. FIG. 2B is a sectional view taken along a line II-II' of FIG. 1. FIG. 2C is a sectional view taken along a line III-III' of FIG. 1.

Referring to the FIGS. 1-2C, the thin film transistor substrate includes a substrate 101, a first wire 180, a first insulating layer 108, a semiconductor layer 123, a second insulating layer 110 and a second wire 190.

The first wire 180 is formed on the substrate 101. The first wire 180 includes a gate line 104 and a gate electrode 102 electrically connected to the gate line 104. In addition, the first wire 180 may further include a storage capacitor electrode 106 partially overlapped with a pixel electrode 122 to form a storage capacitor that maintains a storage capacitance and a first gate pad electrode 152 for forming a gate pad 150.

The first insulating layer 108 is formed on the substrate 101 on which the first wire 180 is formed to cover the first wire 180.

The semiconductor layer 123 is formed on the first insulating layer 108 to be overlapped with the gate electrode 102.

The second insulating layer 110 is formed on the first insulating layer 108 on which the semiconductor layer 123 is formed. The second insulating layer 110 has a plurality of contact holes 132 and 134 through which the semiconductor pattern 123 is partially exposed.

The second wire 190 is formed on the second insulating layer 110. A portion of the second wire 190 makes contact with the semiconductor layer 123 through the contact holes 132 and 134 formed through the second insulating layer 110. For example, the second wire 190 includes a data line 124, a source electrode 126 electrically connected to the data line 124 and a drain electrode 128 spaced apart from the source electrode 126. The source electrode 126 and the drain electrode 128 make contact with the semiconductor layer 123 through the contact holes 132 and 134 formed through the second insulating layer 110, respectively.

The gate electrode 102 electrically connected to the gate line 104, the source electrode 126 electrically connected to the data line 124, the drain electrode 128 electrically connected to the pixel electrode 122 and the semiconductor layer 123 form the thin film transistor 130. The semiconductor layer 123 is overlapped with the gate electrode 102, and the first insulating layer 108 is interposed between the semiconductor layer 123 and the gate electrode 102. The semiconductor layer 123 forms a channel between the source electrode 126 and the drain electrode 128.

A gate pad 150 is connected to the gate line 104. A gate signal from an outer gate driver IC (not shown) is delivered to the gate line 104 through the gate pad 150. In the event that a gate driver circuit is integrated within the thin film transistor array substrate, the gate pad 150 is not necessitated and the gate signal from the gate driver circuit is delivered to gate line 104 directly. The gate signal is for selecting a gate line and for turning on the thin film transistors connected to the selected gate line.

A data pad 160 is connected to the data line 124. A data signal from an outer data driver IC (not shown) is applied to the data line 124 through the data pad 160. In the event that a data driver circuit is integrated within the thin film transistor array substrate, the data pad 160 is not necessitated and the data signal from the data driver circuit is applied to data line 124 directly. The data signal is for delivering image information.

A part of the pixel electrode 122 overlaps with the storage capacitor electrode 106 and forms a storage capacitor so as to maintain a voltage level in a pixel electrode 122 during 1 frame period.

When a gate-on voltage as a gate signal is applied to the gate electrode 102, the transistor 130 is turned on and. At this moment, a data voltage as a data signal is applied from the source electrode 126 to the drain electrode 128 through the semiconductor layer 123. At this moment, the semiconductor layer 123 functions as a channel region.

The semiconductor layer 123 includes semiconductor oxide such as zinc oxide. The semiconductor layer 123 may include indium oxide or gallium oxide. For example, the semiconductor layer 123 may include indium zinc oxide 9InZnO) or gallium indium zinc oxide (GaInZnO), wherein Ga:In:Zn is 1:1:1 or 2:2:1. The thin film transistor 130 transmits an image signal to the pixel electrode 122 through the data line based on a scan signal of the gate line 104.

The gate line 104 transmits the scan signal that is from the gate pad 150 to the gate electrode 102 of the thin film transistor 130. The gate line 104, the gate electrode 102 and the storage capacitor electrode 106 are formed from a same metal layer on the substrate 101. Examples of a metal that may be used for forming the gate line 104, the gate electrode 102 and the storage capacitor electrode 106 include copper (Cu), copper alloy, molybdenum (Mo), molybdenum alloy, aluminum (Al), aluminum alloy, etc. These may be used alone or in a combination thereof.

The data line 124 crosses the gate line 104, and the first insulating layer 108 is interposed between the data line 124 and the gate line 104. The data line 124 applies the pixel signal that is from the data pad 150 to the source electrode 126 of the thin film transistor 130.

The second wire 190 including the data line 124, the source electrode 126 and the drain electrode 128 comprises at least two layers including a transparent conductive layer. For Example, the second wire 190 comprises a first conductive layer 105 made of transparent conductive material, and a second conductive layer 107 made of low resistance conductive material.

For example, the first conductive layer 105 is made of poly-crystalline Indium Tin Oxide (p-ITO) of indium zinc oxide (IZO), and the second conductive layer 107 is made of material selected from a group of copper (Cu), copper alloy, molybdenum (Mo), molybdenum alloy, aluminum (Al), aluminum alloy, titanium (Ti) and titanium alloy.

The first conductive pattern 105 includes a first data line part 105a for forming the data line 124, a first source electrode part 105b for forming the source electrode 126 and a first drain electrode part 105c for forming the drain electrode 128. Also, the first conductive pattern 105 may further include a second gate pad electrode 156 for forming the gate pad 150 and a first data pad electrode 166 for forming the data pad 160.

The second conductive pattern 107 includes a second data line part 107a for forming the data line 124, a second source electrode part 107b for forming the source electrode 126 and a second drain electrode part 107c for forming the drain electrode 128. Also, the second conductive pattern 107 may further include a third gate pad electrode 158 for forming the gate pad 150 and a second data pad electrode 168 for forming the data pad 160.

The first source electrode part 105b and the first drain electrode part 105c increases an adhesive strength against the semiconductor layer 123 having semiconductor oxide. The first source electrode part 105b and the first drain electrode part 105c have lower resistance and better ohmic contact characteristic than a first source electrode part and a first drain electrode part only including the transparent conductive material.

The second conductive layer 107 reduces signal delay in the data line 124 and source electrode 126, because it is made of low resistance material aforementioned.

The first conductive pattern 105 includes the pixel electrode 122 electrically connected to the drain electrode 128. The pixel electrode 122 extends from the first drain electrode part 105c of the drain electrode 128 on the second insulating layer 110. When the pixel signal is applied to the pixel electrode 122 through the thin film transistor 130, an electric field is formed between the pixel electrode and a common electrode receiving a common voltage. Thus, liquid crystal molecules interposed between the thin film transistor array substrate and the color filter substrate rotate in response to an anisotropy of dielectric constant. Therefore, light transmittance of a pixel region is changed by the rotation of the liquid crystal molecules, so that the image having a predetermined gray-scale is displayed.

The thin film transistor array substrate may further include the gate pad 150 electrically connected to an end of the gate line 104 and the data pad 160 electrically connected to an end of the data line 124.

The gate pad 150 is electrically connected to a gate driver (not shown) to apply a scan signal from the gate driver to the gate line 104. In FIG. 2B, the gate pad 150 comprises a first gate pad electrode 152, a second gate pad electrode 156 and a third gate pad electrode 158 formed on the second gate pad electrode 156. The first gate pad electrode 152 is formed from a same layer as the first wire, and the second gate pad electrode 156 is formed from a same layer as the first conductive pattern 105. The third gate pad electrode 158 is formed from a same layer as the second conductive pattern 107. The first gate pad electrode 152 extends from the gate line 104, and the second and third gate pad electrodes 156 and 158 are connected to the first gate pad electrode 152 through a gate pad contact hole 154 in a first insulating layer 108.

The data pad 160 is electrically connected to a data driver (not shown) to apply the pixel signal that is from the data driver to the data line 124. In FIG. 2C, the data pad 160 comprises a first data pad electrode 166 extended from the first data line part 105a of the data line 124 and a second data pad electrode 168 extended from the second data line part 107a on the first data pad electrode 166. The first data pad electrode 166 is formed from a same layer as the first conductive pattern 105, and the second data pad electrode 168 is formed from a same layer as the second conductive pattern 107.

Referring to FIGS. 3A-7C, the major steps for fabricating the structure of the first embodiment of the invention will be explained.

FIGS. 3A-7C are sectional views to illustrate major steps for fabricating the structure of FIGS. 2A to 2C. In particular, FIGS. 3A, 4A, 5A, 6A and 7A are sectional views illustrating a process shown in FIG. 2A. FIGS. 3B, 4B, 5B, 6B and 7B are sectional views illustrating a process shown in FIG. 2B. FIGS. 3C, 4C, 5C, 6C and 7C are sectional views illustrating a process shown in FIG. 2C.

Figure 3A:
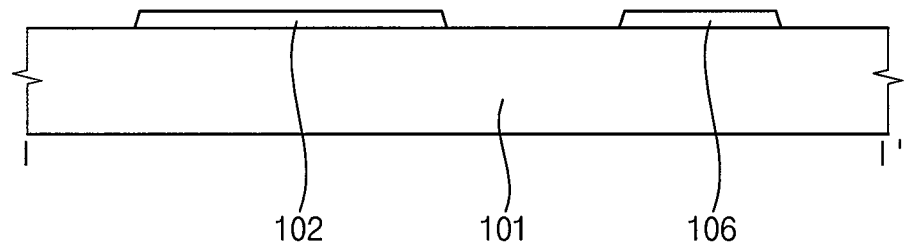
FIGS. 3A-7C are sectional views to illustrate major steps for fabricating the structure of FIGS. 2A to 2C.
Figure 3B:
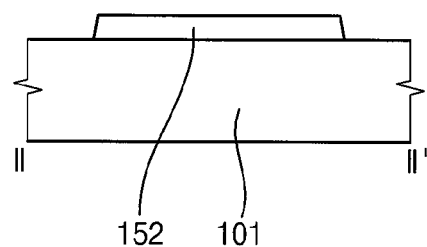
Figure 3C:
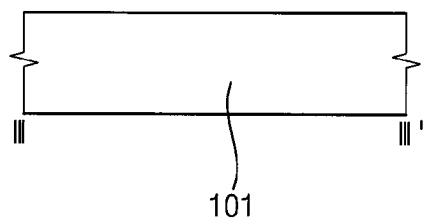

Referring to FIGS. 1, 3A and 3C, the first wire 180 including the gate line 104 and the gate electrode 102, the first gate pad electrode 152 and the storage capacitor electrode 106 is formed on the base substrate 101.

Below are the detailed processes for the first wire pattern.

A conductive layer for the first wire pattern is formed on the base substrate 101 by a known thin film deposition method such as sputtering or chemical vapor deposition (CVD).

The conductive layer for the first wire pattern is patterned by photolithography processes to form the gate line 104, the gate electrode 102, the first gate pad electrode 152, and the storage capacitor electrode 106.

The first wire pattern is composed of a single layer including material selected from a group of copper (Cu), copper alloy, molybdenum (Mo), molybdenum alloy, aluminum (Al), aluminum alloy, titanium (Ti) and titanium alloy. However, the first wire pattern may be composed of double or multiple layers including a main wire layer made of material aforementioned and the additional layer(s) positioned upper or lower side of the main wire layer for a specific purpose such as low contact resistance and/or diffusion barrier characteristics.

Figure 4A:
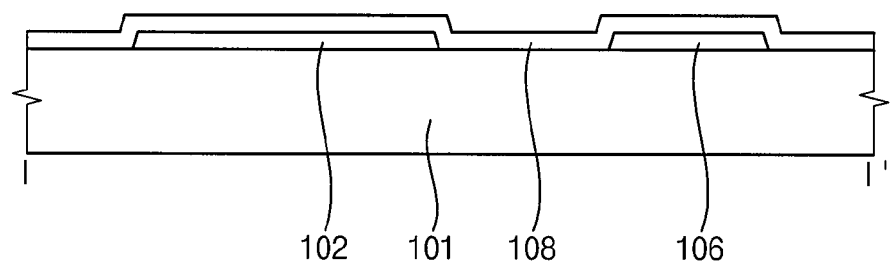
Figure 4B:
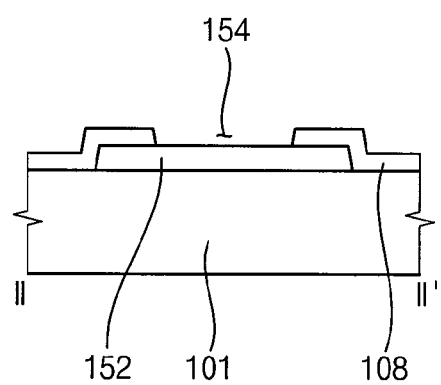
Figure 4C:
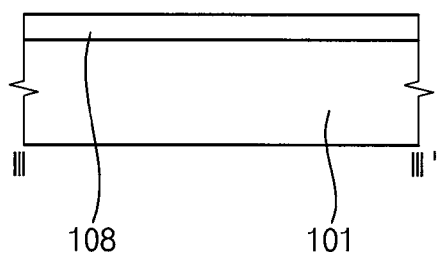

Forming the first insulating layer 108 and its patterning processes will be explained with reference to FIGS. 4A to 4C.

Over the first wire pattern on the base substrate 101, the first insulating layer 108 made of material such as silicon nitride is formed by CVD. Next, a contact hole 154 is formed on the first gate pad electrode 152 by a photolithography method. The first insulating layer 108 functions as a gate insulator.

Figure 5A:
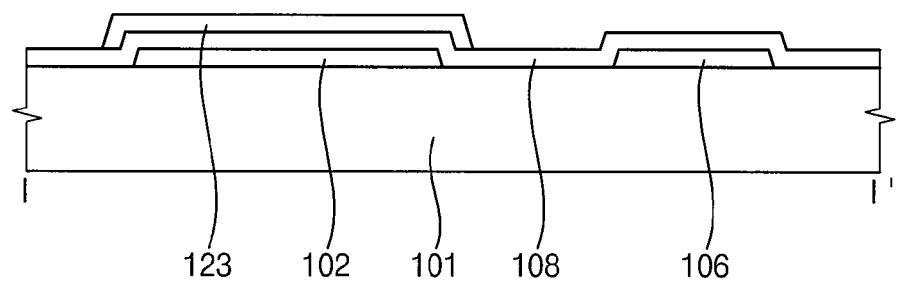
Figure 5B:
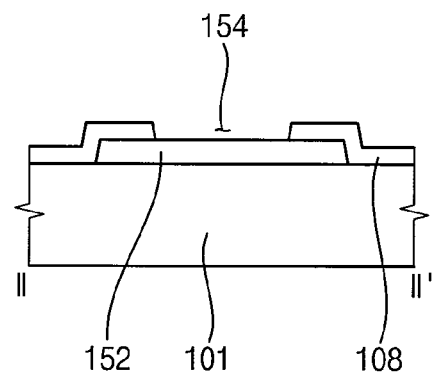
Figure 5C:
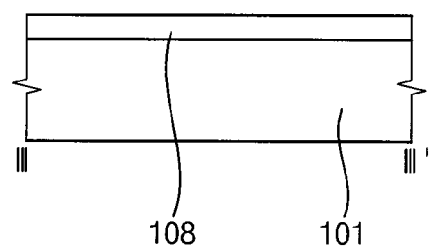

Next, as shown by the FIGS. 5A to 5C, the semiconductor layer 123 is formed on the substrate 101 on which the first insulating layer 108 is formed. Specifically, the semiconductor material film including semiconductor oxide such as zinc oxide is deposited by sputtering or MOCVD(Metal Organic Chemical Vapor Deposition). The semiconductor material film may include indium oxide or gallium oxide. For example, the semiconductor material film may include indium zinc oxide (InZnO) or gallium indium zinc oxide (GaInZnO), wherein Ga:In:Zn is 1:1:1 or 2:2:1.

The deposited semiconductor film is then patterned by a photography method to form the semiconductor layer 123. In the photolithography processes, wet etching may be performed.

Figure 6A:
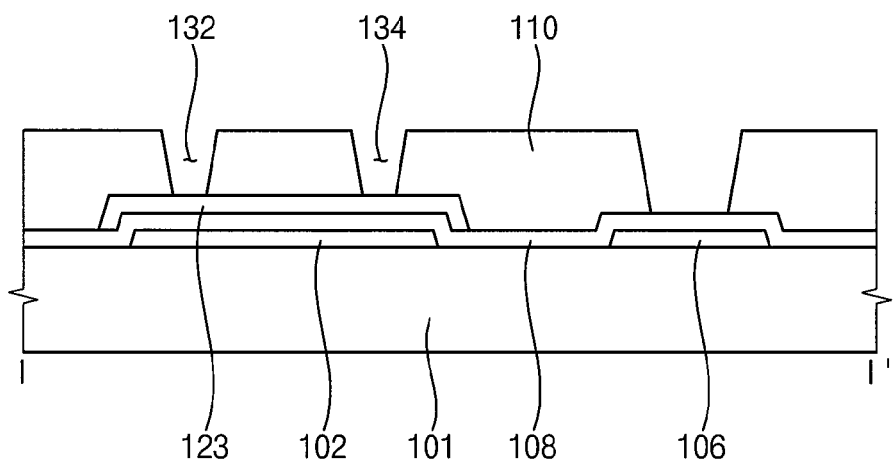
Figure 6B:
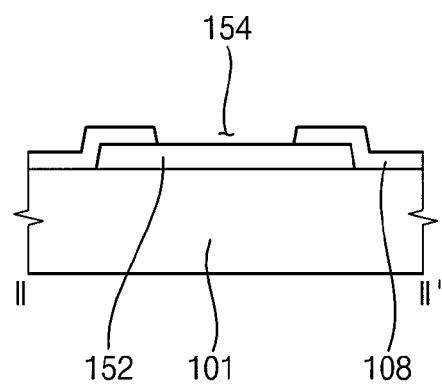
Figure 6C:
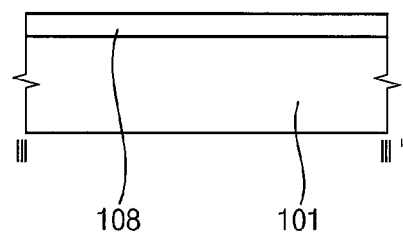

Next, referring to FIGS. 6A to 6C, the second insulating layer 110 is formed on the first insulating layer 108 on which the semiconductor layer 123 is formed.

Organic material such as acrylic resin is deposited by slit coating or spin coating method. After that, contact holes 132, 134 and 136 are formed by a photography method. The contact holes 132 and 134 are for the contacts between the semiconductor layer 123 and the source electrode 126 and the drain electrode 128. The second insulating layer 110 functions as a second insulating layer. The second insulating layer 110 may not be formed in a region corresponding to the gate pad 150 and the data pad 160 as shown in FIGS. 6B and 6C.

Forming the second wire including the data line 124, the source electrode 126 and the drain electrode 128 will be explained with reference to the FIGS. 7A to 7C.

The first conductive layer 115 and the second conductive layer 117 are formed on the second insulating layer 110.

The first conductive layer 115 is made of transparent conductive material, and the second conductive layer 117 is made of low resistance conductive material. For example, the first conductive layer 115 is made of poly-crystalline Indium Tin Oxide (p-ITO) of indium zinc oxide (IZO), and the second conductive layer 117 is made of material selected from a group of copper (Cu), copper alloy, molybdenum (Mo), molybdenum alloy, aluminum (Al), aluminum alloy, titanium (Ti) and titanium alloy.

A photo-resist material is deposited on the first and the second conductive layers 115 and 117 and then patterned to form the first and second patterns P1 and P2. Specifically, a mask pattern as shown in FIGS. 7A to 7C is used.

The mask 170 includes an area M1 in which a light blocking layer 172 is formed on a quartz substrate 171, an area M2 in which a plurality of slit light blocking layer 173 is formed on the quartz substrate 171 and an area M3 in which only the quartz substrate 171 is disposed.

The area M1 corresponds to an area where the data line 124, the source electrode 126, the drain electrode 128, the gate pad 150 and the data pad 160 will be formed. During an exposure process, the area M1 blocks light from an exposure system to form the first pattern P1.

The area M2 corresponds to an area where the pixel electrode 122 will be formed. During the exposure process, the area M2 transmits in part the light from the exposure system to form the second pattern P2 with less height than the first pattern P1.

The area M3 corresponds to an area where the photo-resist is removed by the exposure process to expose the first conductive layer 105 and the second conductive layer 107.

After that, the exposed first and second conductive layers 105 and 107 are first etched by using the first and second patterns P1 and P2 as mask. Thus, the first conductive pattern 105 is formed from the first conductive layer 115.

Next, during an ashing process using O2 gas the first pattern P1 is partially etched and the second pattern P2 is wholly removed. The exposed second conductive layer 117 is then second etched by using the partially etched first pattern P1 as a mask. Thus, the second conductive pattern 107 is formed from the second conductive layer 117.

As a resultant structure shown in FIGS. 2A to 2C formed by the first and second etching processes for etching the first and second conductive layers 115 and 117, the data line 124, the source electrode 126, the drain electrode 128, the second and third gate pad electrodes 156 and 158, and the first and second data pad electrodes 166 and 168 made of the first and second conductive layers 105 and 107 are formed, and the pixel electrode 122 made of the first conductive layer 105 is formed.

According to the thin film transistor array substrate structure and processes aforementioned, the second insulating layer 110 covers the semiconductor layer 123 before patterning the second wire. Therefore, when patterning of second wire, the below semiconductor layer 123 is surely protected by the second insulating layer 110, so as to keep a good characteristic of thin film transistor and display quality.

Next, a thin film transistor array substrate according to another embodiment of the present invention will be explained with reference to FIGS. 8-10C.

The same reference numbers are used for some elements having the same functions as the corresponding elements in FIGS. 1-7C, and detailed explanation of them is omitted.

Figure 8:
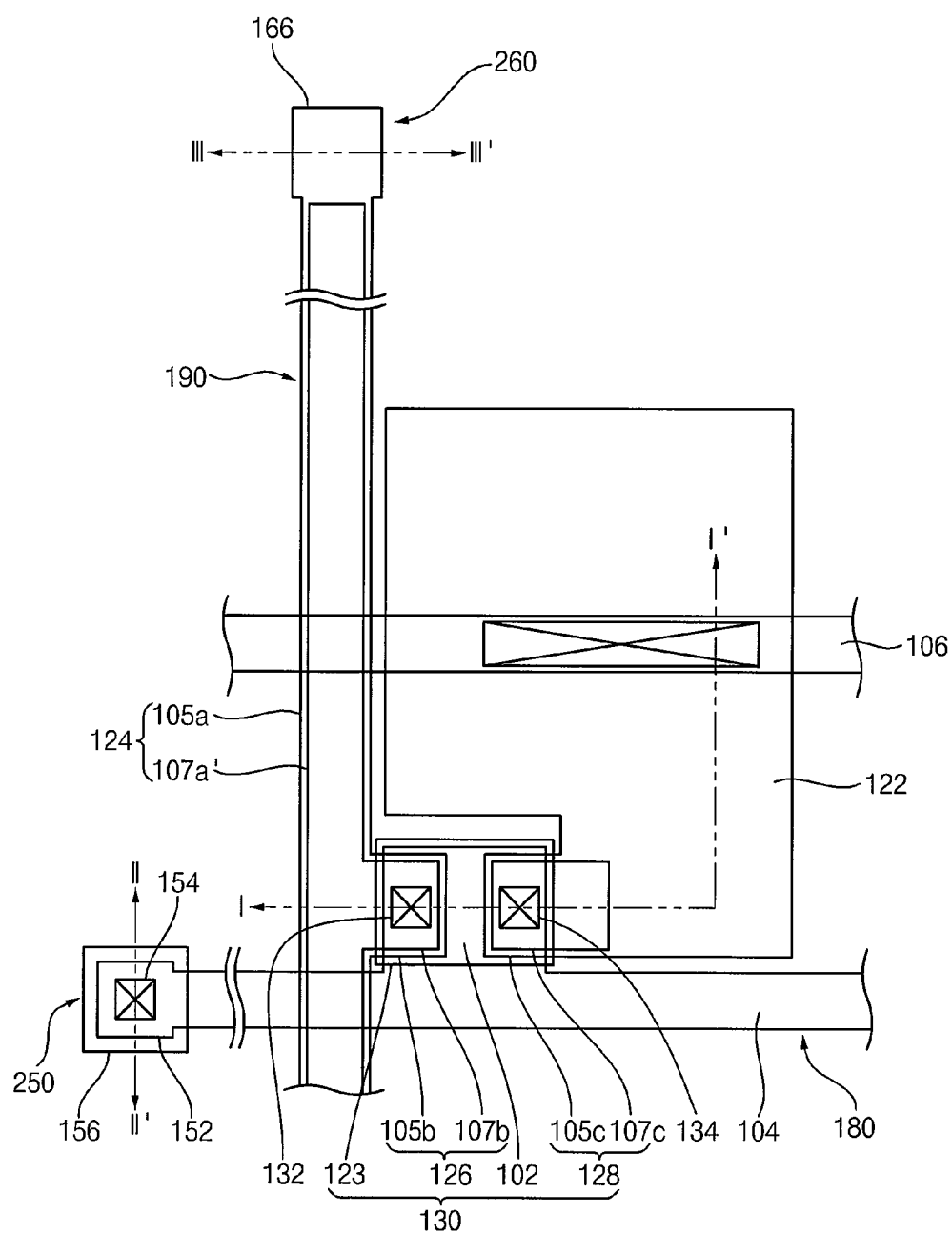
FIG. 8 is a layout illustrating a part of a thin film array substrate according to another embodiment of the present invention.
Figure 9A:
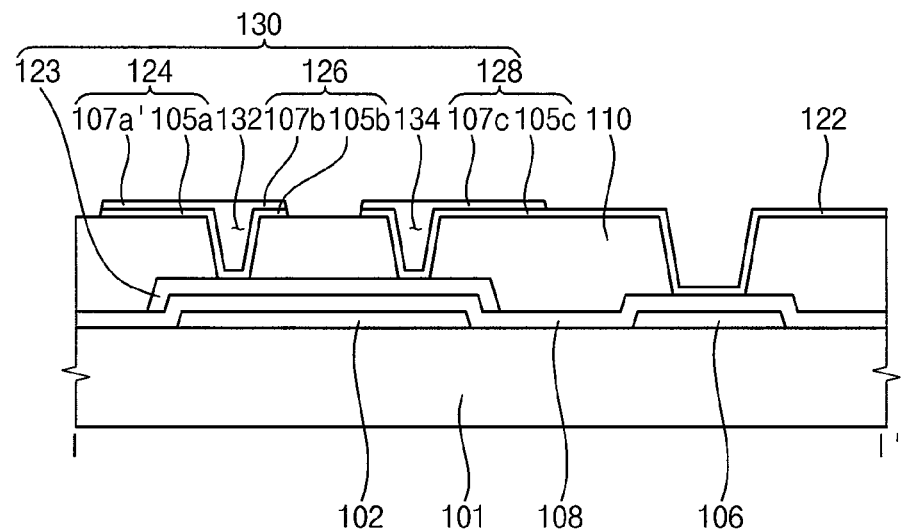
FIG. 9A is a sectional view taken along a line I-I' of FIG. 8.
Figure 9B:
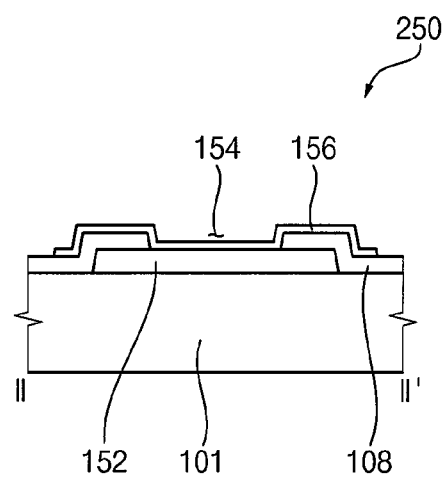
FIG. 9B is a sectional view taken along a line II-II' of FIG. 8.
Figure 9C:
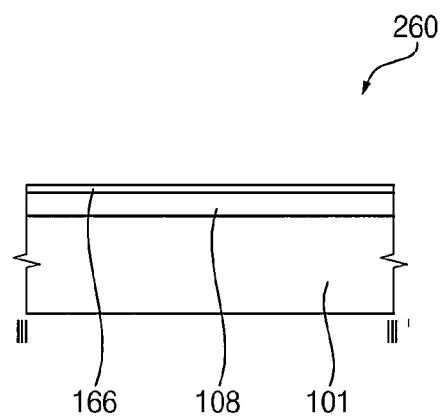
FIG. 9C is a sectional view taken along a line III-III' of FIG. 8.

FIG. 8 is a layout illustrating a part of a thin film array substrate according to another embodiment of the present invention, and FIG. 9A is a sectional view taken along a line I-I' of FIG. 8. FIG. 9B is a sectional view taken along a line II-II' of FIG. 8, and FIG. 9C is a sectional view taken along a line III-III' of FIG. 8.

Referring to FIGS. 8, 9A, 9B and 9C, the gate pad 250 comprises a first gate pad electrode 152 and a second gate pad electrode 156. The first gate pad electrode 152 extends from the gate line 104, and the second gate pad electrode 156 is connected to the first gate pad electrode 152 through a gate pad contact hole 154 in a first insulating layer 108. The second gate pad electrode 156 is made of a conductive layer for forming the first conductive layer 115.

The data pad 260 only comprises a first data pad electrode 166 made of the first conductive layer 115. The first data pad electrode 166 extends from the first data line part 105a over the first insulating layer 108.

Figure 10A:
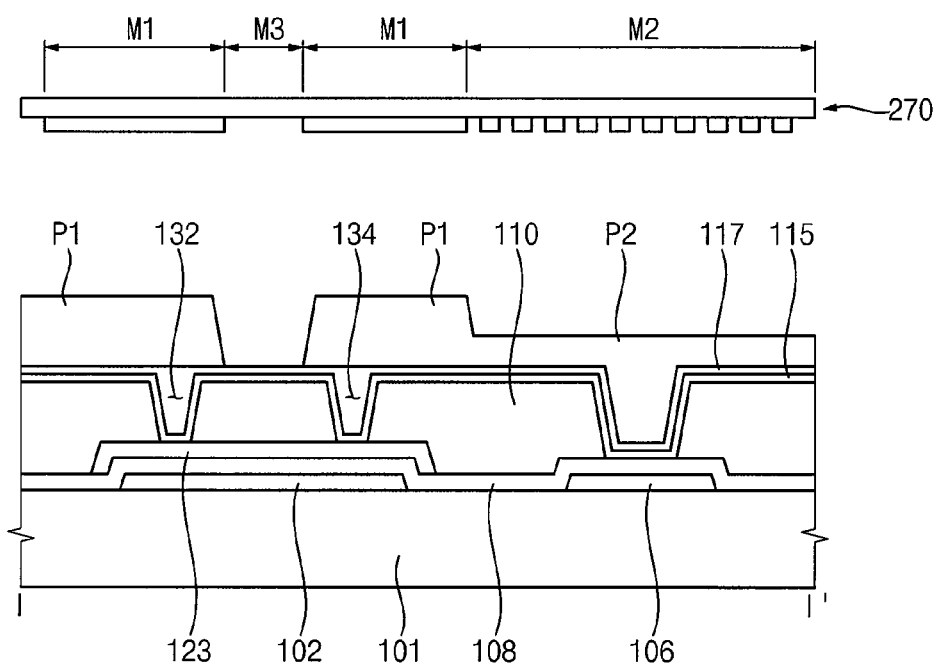
FIGS. 10A to 10C are sectional views to illustrate a major step for fabricating the structure of FIGS. 9A to 9C, respectively.
Figure 10B:
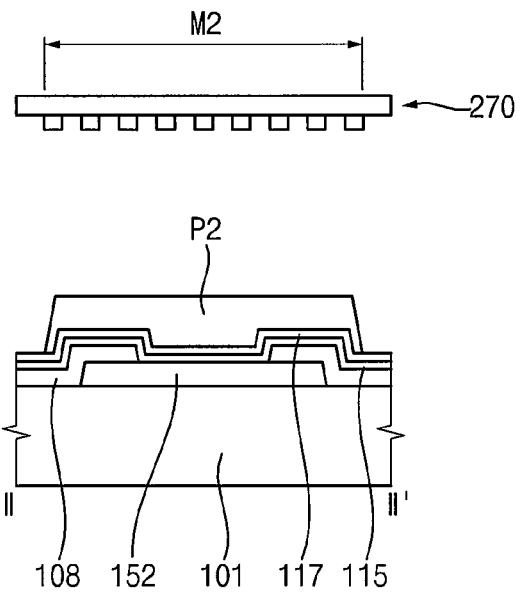
Figure 10C:
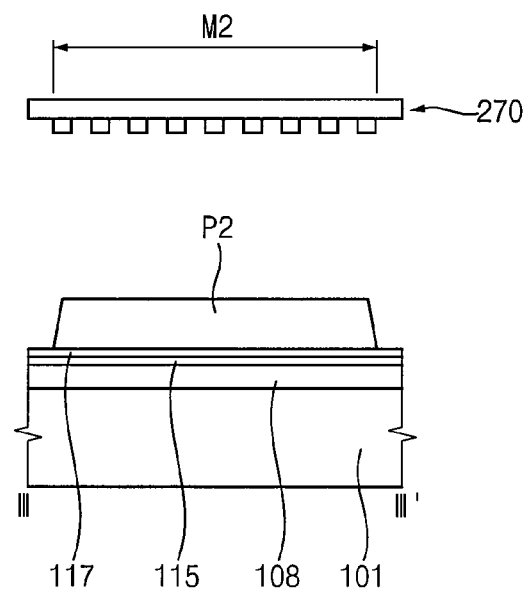

Referring to FIGS. 10A to 10C, the major step for fabricating the structure of this embodiment of the invention will be explained.

The processes explained with reference to FIGS. 3A-6C will be shared for explaining this embodiment. The first wire 180, the first insulating layer 108, the semiconductor layer 123 and the second insulating layer 110 are formed through the processes shown in FIGS. 3A to 6C.

A first conductive layer 115 and a second conductive layer 117 are formed on the substrate 101 on which the first insulating layer 110 is formed, in sequence. A photo-resist material is deposited on the first and second conductive layers 115 and 117 and then patterned to form the first and second patterns P1 and P2. Specifically, a mask pattern as shown in FIG. 10 is used.

The mask pattern includes an area M1, an area M2 and an area M3.

The area M1 corresponds to an area where the data line 124, the source electrode 126 and the drain electrode 128 will be formed. During an exposure process, the area M1 blocks light from an exposure system to form the first pattern P1.

The area M2 corresponds to an area where the pixel electrode 122, the gate pad 250 and the data pad 260 will be formed. During the exposure process, the area M2 transmits in part the light from the exposure system to form the second pattern P2 with less height than the first pattern P1. For example, the mask pattern in the area M2 includes slits.

The area M3 corresponds to an area where the photo-resist is removed by the exposure process to expose the first conductive layer 115 and the second conductive layer 117.

After that, the exposed first and second conductive layers 115 and 117 are etched by using the first and second patterns P1 and P2 as mask.

Next, during an ashing process using O2 gas the first pattern P1 is partially etched and the second pattern P2 is wholly removed. The exposed second conductive layer 117 is then etched by using the partially etched first pattern P1 as a mask.

As a resultant structure shown in FIGS. 9A to 9C, the data line 124, the source electrode 126 and the drain electrode 128 made of the first and second conductive layers 115 and 117 are formed, and the pixel electrode 122, the second gate pad electrode 156 and the first data pad electrode 166 made of the first conductive layer 115 is formed.

Figure 7A:
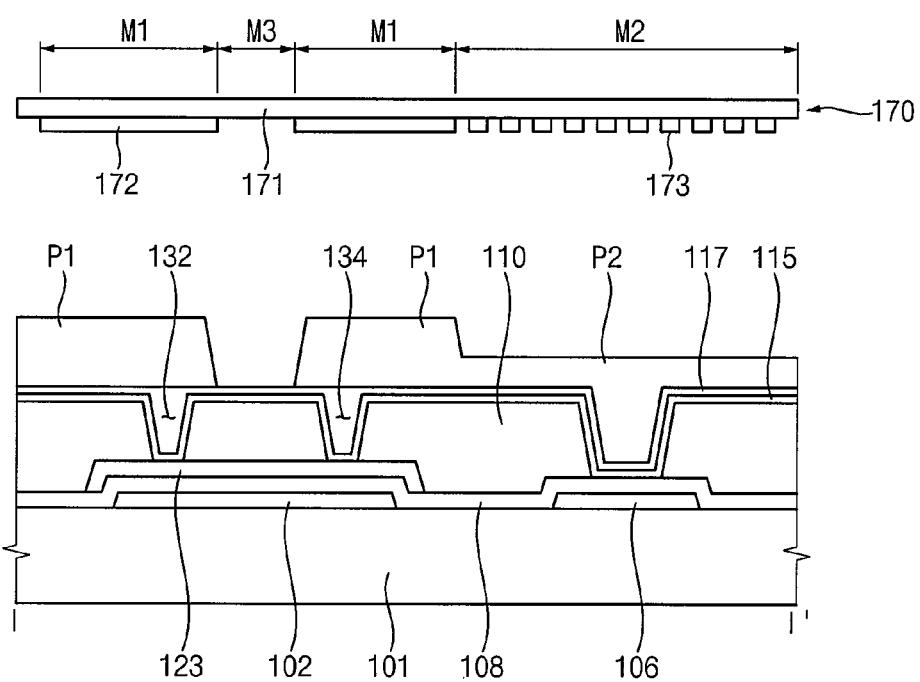
Figure 7B:
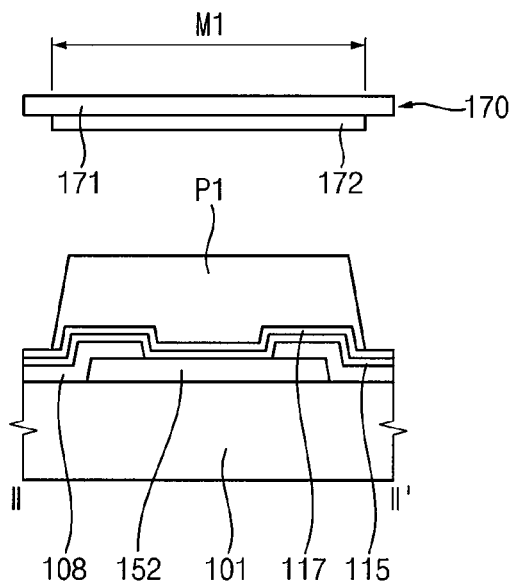
Figure 7C:
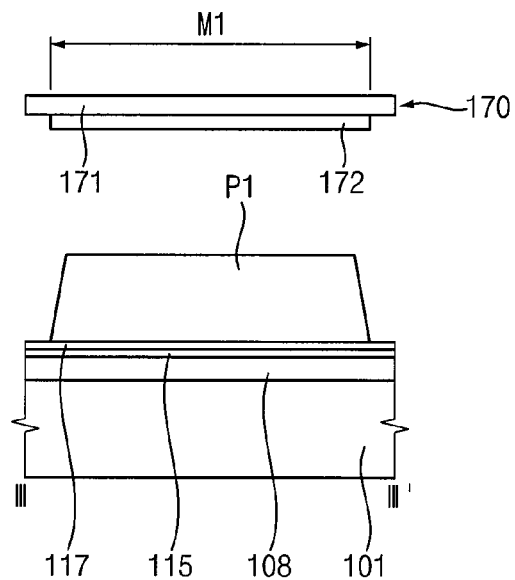

In contrast with the case of FIGS. 7A to 7C, the second pattern P2 also corresponds to an area where the gate pad 250 and the data pad 260 will be formed.

According to the thin film transistor array substrate structure and processes of the FIGS. 8-10C, the second gate pad electrode 156 and the first data pad electrode 166 is made of the first conductive layer 115 only.

As explained above, the first conductive layer 115 is made of transparent conductive material, such as poly-crystalline Indium Tin Oxide (p-ITO) of indium zinc oxide (IZO), so the gate pad 250 and the data pad 260 can be connected to the gate or diver ICs with having more stability.

In the present example embodiment, the gate pad 250 and the data pad 260 may be formed from a same layer as the pixel electrode 122, so that an additional process for forming the gate pad 250 and the data pad 260 may be omitted.

Also, according to the thin film transistor array substrate structure and processes of the FIGS. 8-10C, the second insulating layer 110 covers the semiconductor layer 123 before patterning the second wire. Therefore, when patterning of second wire, the below semiconductor layer 123 is surely protected by the second insulating layer 110, so as to keep a good characteristic of thin film transistor and display quality.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A thin film transistor array substrate comprising:
   a base substrate;
   a first wire on the base substrate;
   a first insulating layer on the base substrate to cover the first wire;
   a semiconductor layer on the first insulating layer;
   a second insulating layer on the first insulating layer on which the semiconductor layer is formed, the second insulating layer having a contact hole extending to the semiconductor layer;
   a second wire on the second insulating layer, a portion of the second wire making contact with the semiconductor layer through the contact hole, the second wire including a first conductive layer and a second conductive layer formed on the first conductive layer; and
   a pixel electrode including a same layer as the first conductive layer, the pixel electrode making contact with a portion of the second wire.

2. The thin film transistor array substrate of claim 1, wherein the semiconductor layer comprises semiconductor oxide.

3. The thin film transistor array substrate of claim 2, wherein the semiconductor oxide comprises zinc oxide.

4. The thin film transistor array substrate of claim 3, wherein the semiconductor oxide comprises at least one selected from the group consisting of indium and gallium.

5. The thin film transistor array substrate of claim 1, wherein the second conductive layer includes a different material from the first conductive layer.

6. The thin film transistor array substrate of claim 5, wherein the first conductive layer includes conductive oxide.

7. The thin film transistor array substrate of claim 6, wherein the conductive oxide includes indium tin oxide (ITO) or indium zinc oxide (IZO).

8. The thin film transistor array substrate of claim 5, wherein the first conductive layer includes a gate line and a gate electrode electrically connected to the gate line,
   the second conductive layer includes a data line, a source electrode electrically connected to the data line and a drain electrode spaced apart from the source electrode, and
   the source electrode and the drain electrode are electrically connected to the semiconductor layer through contact holes formed through the second insulating layer, respectively.

9. The thin film transistor array substrate of claim 8, wherein the first conductive layer includes a first gate pad electrode electrically connected to the gate line.

10. The thin film transistor array substrate of claim 9, wherein the first conductive layer includes a second gape pad electrode electrically connected to the first gate pad electrode through a contact hole formed through the first insulating layer.

11. The thin film transistor array substrate of claim 10, wherein the second conductive layer includes a third gate pad electrode on the second gate pad electrode.

12. The thin film transistor array substrate of claim 8, wherein the first conductive layer includes a first data pad electrode electrically connected to the data line.

13. The thin film transistor array substrate of claim 12, wherein the second conductive layer includes a second data pad electrode on the first data pad electrode.

14. The thin film transistor array substrate of claim 8, wherein the first conductive layer includes a pixel electrode electrically connected to the drain electrode.

15. A manufacturing method of a thin film transistor array substrate comprising:
   forming a first wire on a base substrate;
   forming a first insulating layer on the base substrate to cover the first wire;
   forming a semiconductor layer on the first insulating layer;

forming a second insulating layer on the first insulating layer on which the semiconductor layer is formed;
forming a contact hole in the second insulating layer;
forming a first conductive layer on the second insulating layer;
forming a second conductive layer on the first conductive layer;
forming a second wire and a pixel electrode on the second insulating layer by patterning the first and second conductive layers so that a portion of the second wire makes contact with the semiconductor layer through the contact hole, and the pixel electrode includes the first conductive layer and makes contact with a portion of the second wire.

16. The manufacturing method of claim 15,
wherein the second conductive layer includes a different material from the first conductive layer, and
wherein forming the second wire and the pixel electrode comprises etching the first and second conductive layers to form a first conductive pattern and a second conductive pattern, respectively.

17. The manufacturing method of claim 16, wherein forming the first and second conductive patterns includes:
first etching the first and second conductive layers to form the first conductive pattern from the first conductive layer; and
second etching the first etched second conductive layer to form the second conductive pattern from the second conductive layer.

18. The manufacturing method of claim 17, wherein a first gate pad electrode and a first data pad electrode are formed from the first conductive layer through the first etching, and a second gate pad electrode and a second data pad electrode are formed from the second conductive layer through the first etching.

19. The manufacturing method of claim 18, wherein the gate pad electrode and the second data pad electrode are removed through the second etching.

20. The manufacturing method of claim 15, wherein the semiconductor layer includes semiconductor oxide.

* * * * *